United States Patent
Hirose et al.

(10) Patent No.: US 12,433,163 B2
(45) Date of Patent: Sep. 30, 2025

(54) THERMOELECTRIC CONVERSION MATERIAL, THERMOELECTRIC CONVERSION ELEMENT, AND THERMOELECTRIC CONVERSION MODULE

(71) Applicant: Sumitomo Electric Industries, Ltd., Osaka (JP)

(72) Inventors: Kotaro Hirose, Osaka (JP); Masahiro Adachi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 75 days.

(21) Appl. No.: 18/379,178

(22) Filed: Oct. 12, 2023

(65) Prior Publication Data

US 2024/0138265 A1    Apr. 25, 2024

(30) Foreign Application Priority Data

Oct. 13, 2022    (JP) .................................. 2022-164577

(51) Int. Cl.
*H10N 10/851* (2023.01)
*H10N 10/17* (2023.01)

(52) U.S. Cl.
CPC .......... *H10N 10/8556* (2023.02); *H10N 10/17* (2023.02)

(58) Field of Classification Search
None
See application file for complete search history.

(56) References Cited

U.S. PATENT DOCUMENTS

| | | | | |
|---|---|---|---|---|
| 2006/0063291 A1* | 3/2006 | Shin | ................ | G01N 27/16 257/65 |
| 2012/0121495 A1* | 5/2012 | Yang | ................ | H10N 10/01 241/23 |
| 2014/0349435 A1* | 11/2014 | Murai | ................ | H10N 10/01 438/54 |

(Continued)

FOREIGN PATENT DOCUMENTS

| | | | |
|---|---|---|---|
| JP | 2000-114606 A | | 4/2000 |
| JP | 2011-527517 A | | 10/2011 |

(Continued)

OTHER PUBLICATIONS

Machine translation of KR20110071291A (Year: 2011).*

(Continued)

*Primary Examiner* — Tamir Ayad
(74) *Attorney, Agent, or Firm* — XSENSUS LLP (57) ABSTRACT

A thermoelectric conversion material includes, a base material composed of SiGe, a first additive element functioning as a dopant, a second additive element different from the first additive element, and oxygen. The second additive element includes at least one of Mg, Ca, and Ti. A content ratio of the second additive element relative to the base material is 0.5 at % to 5 at %. In a rectangular area of a section of the base material, the rectangular area being selected such that a grain boundary intersects opposite sides of the rectangular area, a distribution of the second additive element and the oxygen has a positive correlation. A correlation coefficient of the correlation is in a range of 0.2 or more and less than 1.0.

9 Claims, 7 Drawing Sheets

(56) References Cited

U.S. PATENT DOCUMENTS

2021/0091289 A1* 3/2021 Adachi ............... H10N 10/852

FOREIGN PATENT DOCUMENTS

| JP | 2013-157362 A | | 8/2013 | |
|----|---------------|---|--------|---|
| KR | 20110071291 A | * | 6/2011 | ............. H10N 10/80 |
| WO | 2010/004360 A1 | | 1/2010 | |
| WO | 2013/110999 A1 | | 8/2013 | |

OTHER PUBLICATIONS

Aizawa et al., "Solid-State Synthesis of Thermoelectric Materials in Mg—Si—Ge System", Material Transactions, vol. 46, No. 7, 2005, pp. 1490-1496.

* cited by examiner

THERMOELECTRIC CONVERSION MATERIAL, THERMOELECTRIC CONVERSION ELEMENT, AND THERMOELECTRIC CONVERSION MODULE

CROSS-REFERENCE TO RELATED APPLICATION

This application claims priority based on Japanese Patent Application No. 2022-164577 filed on Oct. 13, 2022, and the entire contents of the Japanese patent application are incorporated herein by reference.

TECHNICAL FIELD

The present disclosure relates to thermoelectric conversion materials, thermoelectric conversion elements, and thermoelectric conversion modules.

BACKGROUND

SiGe-based thermoelectric conversion materials for converting temperature differences (thermal energy) into electricity have been disclosed (see, e.g., PTL1, PTL2, PTL3 and non-PTL1).

PTL 1: Japanese Unexamined Patent Application Publication No. 2000-114606
PTL 2: Japanese Unexamined Patent Application Publication No. 2011-527517
PTL 3: Japanese Unexamined Patent Application Publication No. 2013-157362
Non-PTL 1: Tatsuhiko Aizawa et al., "Solid-State Synthesis of Thermoelectric Materials in Mg—Si—Ge System", Material Transactions, Vol. 46, No. 7 (2005) pp. 1490 to 1496

SUMMARY

A thermoelectric conversion material according to the present disclosure includes a base material composed of SiGe, a first additive element functioning as a dopant, a second additive element different from the first additive element, and oxygen. The second additive element includes at least one of Mg, Ca, and Ti, a content ratio of the second additive element relative to the base material is 0.5 at % to 5 at %, in a rectangular area of a section of the base material, the rectangular area being selected such that a grain boundary intersects opposite sides of the rectangular area, a distribution of the second additive element and the oxygen has a positive correlation, and a correlation coefficient of the correlation is in a range of 0.2 or more and less than 1.0.

DETAILED DESCRIPTION

The conversion efficiency η of a temperature difference (thermal energy) into electrical energy using a thermoelectric conversion material is given by the following equation (1).

$$\eta = \Delta T/T_h \cdot (M-1)/(M+T_c/T_h) \quad (1)$$

η is a conversion efficiency, $\Delta T$ is a difference between the $T_c$ and $T_h$, $T_h$ is a temperature at a high temperature region, $T_c$ is a temperature at a low temperature region—, M is $(1+ZT)^{1/2}$, $ZT=\alpha^2 ST/\kappa$, ZT is a dimensionless figure of merit, α is a Seebeck coefficient, S is a conductivity, and κ is a thermal conductivity. Conversion efficiency is a monotonically increasing function of ZT.

In addition, a power factor (hereinafter, may be abbreviated as "PF") corresponding to a power generation amount per unit temperature difference, is represented by the following equation (2). In equation (2), a is the Seebeck coefficient and S is the conductivity.

$$PF = \alpha^2 \times S \quad (2)$$

For efficient thermoelectric conversion, it is important to increase PF. If PF can be increased, the efficiency of thermoelectric conversion can be improved.

Therefore, to provide a thermoelectric conversion material capable of improving the efficiency of thermoelectric conversion is one of the object.

DESCRIPTION OF EMBODIMENTS OF PRESENT DISCLOSURE

First, embodiments of the present disclosure will be listed and explained.

(1) A thermoelectric conversion material according to the present disclosure includes a base material composed of SiGe, a first additive element functioning as a dopant, a second additive element different from the first additive element, and O (oxygen). The second additive element includes at least one of Mg (magnesium), Ca (calcium), and Ti (titanium). A content ratio of the second additive element relative to the base material is 0.5 at % to 5 at %. In a rectangular area of a section of the base material, the rectangular area being selected such that a grain boundary intersects opposite sides of the rectangular area, a distribution of the second additive element and the oxygen has a positive correlation. A correlation coefficient of the correlation is in a range of 0.2 or more and less than 1.0.

The inventors of the present application have considered that SiGe suitable for use in a thermoelectric conversion material is used as a base material to increase PF and to improve efficiency of thermoelectric conversion. In order to increase PF, it has been considered necessary to suppress the lowering of the conductivity, and the thermoelectric conversion material according to the present disclosure has been constituted. Here, the inventors of the present application have focused on the fact that Si in the base material is oxidized during the manufacturing process, and as a result, the conductivity decreases. Even when a countermeasure such as working in an atmosphere of an inert gas is taken during the manufacturing process, oxygen is contained in the thermoelectric conversion material not a little. As a result of intensive studies, the inventors of the present application have attempted to suppress a decrease in the conductivity of the thermoelectric conversion material and consequently increase PF by incorporating an element that adsorbs oxygen into the thermoelectric conversion material to suppress oxidation of Si. Specifically, in addition to the first additive element that functions as a dopant, the second additive element that traps oxygen is added to form a region of low oxygen concentration in the thermoelectric conversion material, thereby suppressing a decrease in conductivity. In this case, the second additive element and oxygen are further aggregated at the grain boundary to generate an energy filtering effect, thereby increasing the Seebeck coefficient and increasing PF.

According to the thermoelectric conversion material of the present disclosure, the thermoelectric conversion material includes a second additive element different from the first additive element and including at least one of Mg, Ca, and Ti. Such second additive elements are more susceptible to oxidation than Si. Thus, in the thermoelectric conversion material, oxidation of the second additive element can be prioritized over oxidation of Si. In addition, the content ratio of the second additive element relative to the base material is 0.5 at % to 5 at %. By setting the content ratio of the second additive element to 0.5 at % or more, it is possible to sufficiently obtain the effect of suppressing a decrease in conductivity by prioritizing oxidation of the second additive element over oxidation of Si. In addition, by setting the content ratio of the second additive element to 5 at % or less, it is possible to suppress significant precipitation of oxides at the interface of the second additive element due to excessive addition of the second additive element, and to suppress a decrease in conductivity due to scattering of carriers. Furthermore, the rectangular area being selected such that a grain boundary intersects opposite sides of the rectangular area, a distribution of the second additive element and the oxygen has a positive correlation, and a correlation coefficient of the correlation is in a range of 0.2 or more and less than 1.0. In this way, in the distribution of the second additive element and oxygen, it is possible to suppress the uniform oxygen concentration from spreading widely, and to distribute the high oxygen concentration region and the low oxygen concentration region which appear by including the grain boundary. As a result, since the conductivity is high in the low oxygen concentration region, the conductivity can be improved by distributing the low oxygen concentration region as a whole. As described above, the thermoelectric conversion material can improve the efficiency of thermoelectric conversion.

(2) In the above (1), the rectangular area has a size of 100 nm square to 2 μm square and may include a first region in which a concentration of the oxygen is a first concentration and a second region in which a concentration of the oxygen is a second concentration higher than the first concentration. A difference between the first concentration and the second concentration may be 10 at % or more. In this way, the high oxygen concentration region and the low oxygen concentration region are clearly defined to ensure high conductivity in the low oxygen concentration region, and PF is increased to improve the efficiency of thermoelectric conversion.

(3) In (1) or (2) above, the thermoelectric conversion material may include nitrogen (N). In this way, it is possible to obtain a large energy filtering effect, and thus the efficiency of thermoelectric conversion can be further improved.

(4) In any one of (1) to (3) above, the base material may contain an amorphous phase. In this way, the efficiency of thermoelectric conversion can be further improved.

(5) In any one of (1) to (4) above, the first additive element may be any of B (boron), Al (aluminum), Ga (gallium), P (phosphorus), As (arsenic), and Sb (antimony). Such a first additive element is preferably used in thermoelectric conversion materials in which the base material is composed of SiGe.

(6) The thermoelectric conversion element of the present disclosure includes a thermoelectric conversion material unit, a first electrode disposed to be in electrical contact with the thermoelectric conversion material unit, a second electrode disposed to be in electrical contact with the thermoelectric conversion material unit and to be spaced apart from the first electrode. The thermoelectric conversion material unit is composed of the thermoelectric conversion material according to any one of (1) to (5) above, the thermoelectric conversion material containing components adjusted such that a conductivity type is p-type or n-type.

The thermoelectric conversion element of the present disclosure is a thermoelectric conversion material containing components adjusted such that a conductivity type is p-type or n-type and efficiency of the thermoelectric conversion is improved. Therefore, according to the thermoelectric conversion element of the present disclosure, it is possible to provide a thermoelectric conversion element in which the efficiency of thermoelectric conversion is improved.

(7) The thermoelectric conversion module of the present disclosure includes a plurality of the thermoelectric conversion elements. According to the thermoelectric conversion module of the present disclosure, a thermoelectric conversion module with improved thermoelectric conversion efficiency can be obtained by including a plurality of the thermoelectric conversion elements of the present disclosure with improved thermoelectric conversion efficiency.

DETAILS OF EMBODIMENTS OF PRESENT DISCLOSURE

Next, embodiments of the thermoelectric conversion material of the present disclosure will be described with reference to the drawings. In the following drawings, the same or corresponding portions are denoted by the same reference numerals, and description thereof will not be repeated.

First Embodiment

Figure 1:
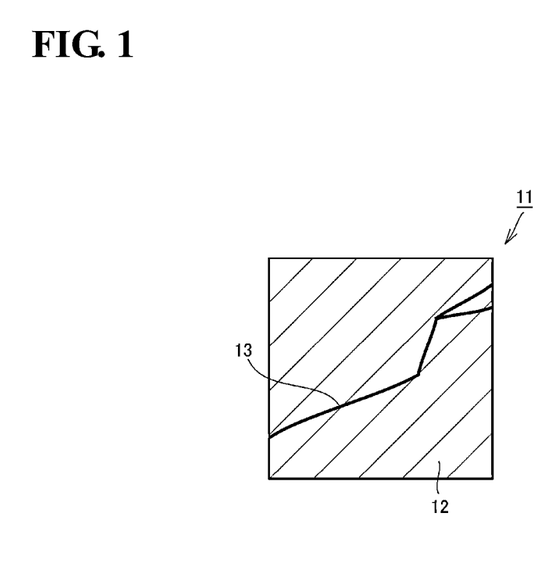
FIG. 1 is a schematic diagram showing the structural state of a thermoelectric conversion material according to a first embodiment.

The constitution of the thermoelectric conversion material in Embodiment 1 of the present disclosure will be described. FIG. 1 is a schematic diagram showing the structural state of a thermoelectric conversion material according to a first embodiment. Referring to FIG. 1, a thermoelectric conversion material 11 according to the first embodiment of the present disclosure includes a base material 12 that is a semiconductor, a first additive element functioning as a dopant, a second additive element different from the first additive element, and oxygen. In the embodiment of the present disclosure, semiconductor base material 12 is SiGe (silicon germanium). Base material 12 includes an amorphous phase. Moreover, in FIG. 1, the first additive element, the second additive element, O, and N to be described later are not shown. In FIG. 1, a grain boundary 13 is shown.

The first additive element has a function as a dopant and is any of B, Al, Ga, P, As, and Sb. Such a first additive element is preferably used in thermoelectric conversion materials in which the base material is composed of SiGe. In the embodiment of the present disclosure, the first additive element is P and Ge. The second additive element has a function as an oxygen getter and contains at least one of Mg, Ca, and Ti. In the embodiment of the present disclosure, Mg is adopted as the second additive element. In addition, thermoelectric conversion material 11 includes N.

Here, in a rectangular area of a section of base material 12, the rectangular area being selected such that grain boundary 13 intersects opposite sides of the rectangular area, a distribution of the second additive element and the oxygen has a positive correlation. A correlation coefficient of the correlation is in a range of 0.2 or more and less than 1.0. In addition, base material 12 includes a first region 16 in which the concentration of oxygen is a first concentration and a second region 17 in which the concentration of oxygen is a second concentration higher than the first concentration in a rectangular area having a 100 nm square to 2 µm square. These will be described in detail later. In addition, difference between the first concentration and the second concentration is equal to or greater than 10 at %. These will be described in detail later.

Next, a method of manufacturing thermoelectric conversion material 11 according to the first embodiment will be briefly described. First, as raw materials to be prepared, Si and Ge as base material elements constituting a base material, P and Ge as a first additive element, and Mg as a second additive element are prepared in a powder state. Here, as the second additive element, Mg—N powder is prepared. In this way, oxidation of Mg in the material preparation step can be prevented.

Next, the raw material powder weighed so as to have a target composition is put into a pulverization container together with milling balls. At this time, oxidation of the raw material powder is suppressed by performing the operation in a glove box the inside of which is replaced with an inert gas atmosphere. Accordingly, the pulverization container is set in a milling apparatus, and milling is performed. The milling is performed, for example, at a rotation speed of 100 rpm to 700 rpm for 5 hours to 10 hours. By this milling step, the raw material powders are mixed and pulverized.

Next, the obtained fine powder is filled in a prepared mold (die). Thereafter, the die is placed in a sintering apparatus, and a sintered body is formed by a spark plasma sintering method. The temperature at this time can be, for example, 500° C. to 1000° C. These steps are also performed in an inert gas atmosphere, such as by replacing the atmosphere in a glove box or a chamber. Thus, thermoelectric conversion material 11 according to the first embodiment is obtained. It is noted that, in this thermoelectric conversion material 11, Mg—N powder is used as the second additive element, and thermoelectric conversion material 11 contains N. In addition, in the example of the manufacturing method described above, the powder of Mg—N is used as the second additive element, but the powder is not limited to this, and the powder of Mg—Si may be used as the second additive element.

It is noted that, the content ratio of the additive element can be measured by, for example, energy dispersive X-ray spectrometry (EDX). The EDX was measured by capturing a transmission electron microscope (TEM) image of a part of thermoelectric conversion material 11. The TEM images were taken with JEM-2800 (manufactured by JEOL Ltd.) under the measurement conditions where the acceleration voltage was 200 kV, the probe size was 0.5 nm, and the CL aperture was 3. Furthermore, EDX (manufactured by Thermo Fisher Scientific Inc.) was used as conditions for detecting atoms by EDX, and as measurement conditions, the spot size was 0.5 nm, the CL aperture was 3, the analytical mode was mapping, and the analytical time was 20 minutes. Furthermore, the content ratio of the additive element of 0.1 at % or less can be measured by, for example, SIMS (Secondary Ion Mass Spectrometry). As a specific measurement method, ADEPT-1010 manufactured by ULVAC, Inc. was used, and CsR+ions were used for additive element R as an ion source for the measurement.

Figure 2:
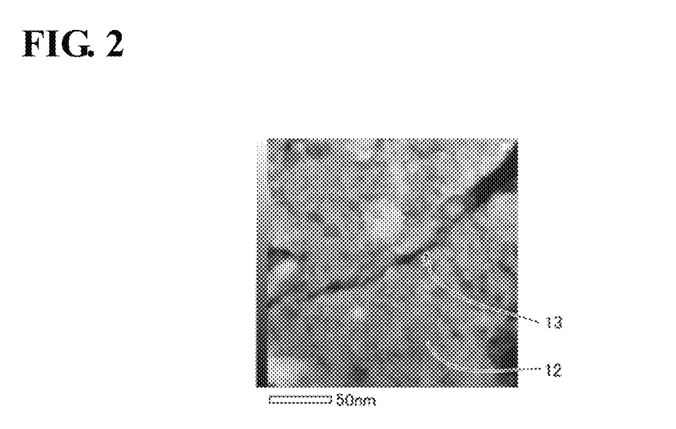
FIG. 2 is a TEM image showing a cross-section of the base material and a portion of the resulting thermoelectric conversion material.
Figure 3:
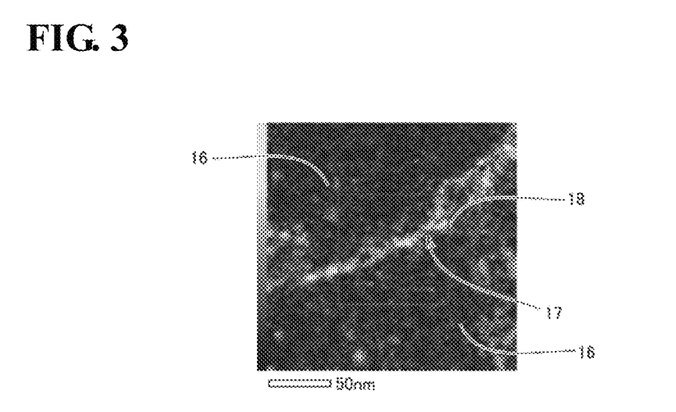
FIG. 3 is a diagram showing a distribution analysis result of O (oxygen) in TEM/EDX.
Figure 4:
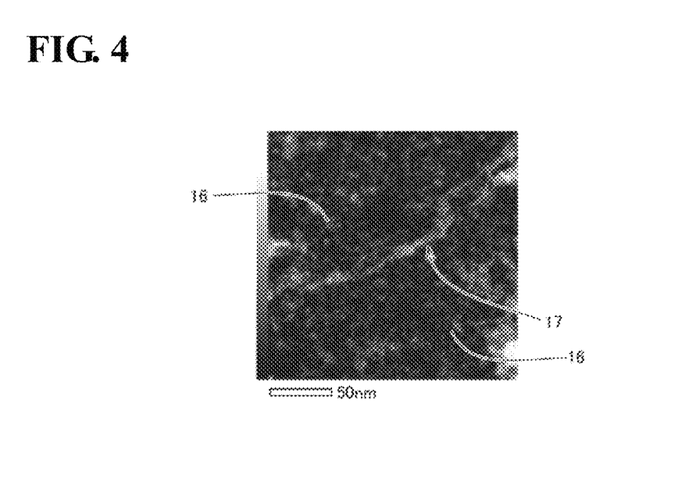
FIG. 4 is a diagram showing a distribution analysis result of Mg (magnesium) in TEM/EDX.

FIG. 2 is a TEM image showing a cross-section of base material 12 and a portion of resulting thermoelectric conversion material 11. FIG. 2 shows the case of n-type SiGe added with 3 at % of Mg. FIG. 3 is a diagram showing a distribution analysis result of O (oxygen) in TEM/EDX. FIG. 4 is a diagram showing a distribution analysis result of Mg (magnesium) in TEM/EDX. The white regions in FIGS. 3 and 4 indicate the state where each element is present at a high concentration. Referring to FIGS. 2, 3 and 4 together, in thermoelectric conversion material 11 according to the first embodiment, grain boundary 13 is seen in base material 12. Furthermore, referring particularly to FIG. 3, second region 17, which is a high concentration region of oxygen, is disposed in the vicinity of grain boundary 13. A region excluding grain boundary 13 is first region 16, which is a region with low oxygen concentration. In addition, referring particularly to FIG. 4, magnesium is also disposed at a high concentration in the vicinity of grain boundary 13. In other words, it can be grasped that magnesium, which is more easily oxidized than Si, captures oxygen and is oxidized and appears in the vicinity of grain boundary 13. Region 18 is a region of a 100 nm square, and is selected so that second region 17, which is the high oxygen concentration region, and, particularly, grain boundary 13 intersect opposite sides of the square (rectangular area).

Figure 5:
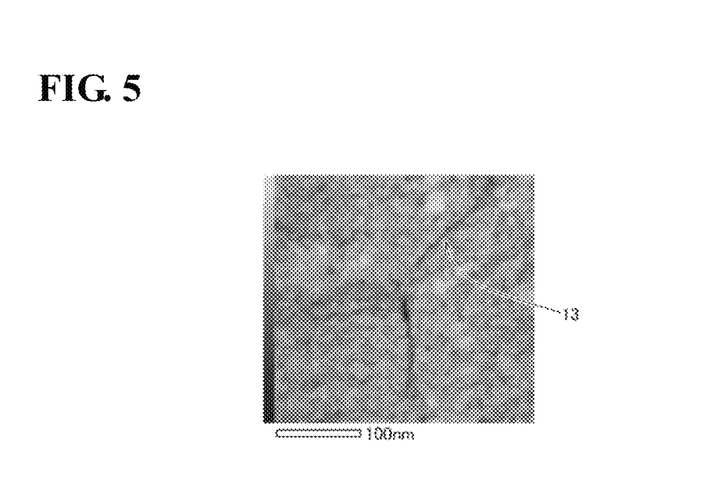
FIG. 5 is a TEM image showing a portion of a thermoelectric conversion material without a second additive element that is outside the scope of the present disclosure.
Figure 6:
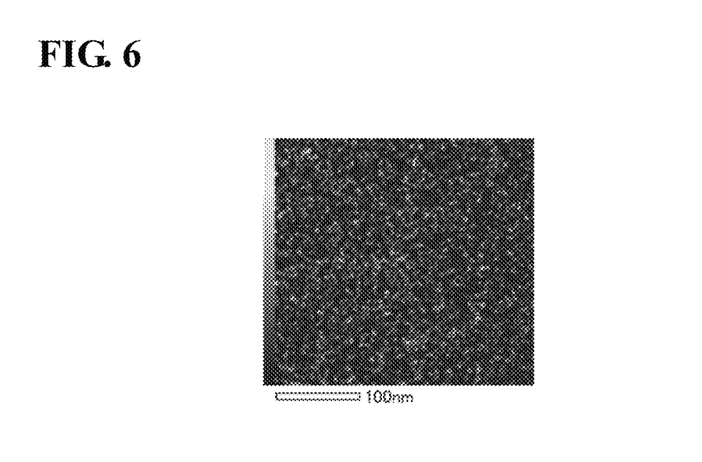
FIG. 6 is diagram showing a distribution analysis result of O (oxygen) in TEM/EDX of thermoelectric conversion materials outside the scope of the present disclosure.

It is noted that, examples of thermoelectric conversion materials outside the scope of the present disclosure are as follows. FIG. 5 is a TEM image showing a portion of a thermoelectric conversion material without a second additive element that is outside the scope of the present disclosure. FIG. 6 is diagram showing a distribution analysis result of O (oxygen) in TEM/EDX of thermoelectric conversion materials outside the scope of the present disclosure. The thermoelectric conversion materials shown in FIGS. 5 and 6 are the same as those of the first embodiment except that they do not contain the second additive element (e.g., Mg). Referring to FIGS. 5 and 6, in the thermoelectric conversion material outside the scope of the present disclosure, although grain boundary 13 is present, oxygen is not concentrated in grain boundary 13, and the concentration of oxygen is uniformly distributed in any region. The thermoelectric conversion material has a uniform oxygen content of 2.2 at % or less. Moreover, in thermoelectric conversion material 11 according to the first embodiment shown in FIGS. 2 to 4, second region 17, which is a high concentration region, has a high oxygen content ratio of 15 at %, but first region 16, which is the other region, has a very low oxygen content ratio of 0.7 at % or less. First region 16 having a low oxygen concentration can suppress a decrease in conductivity. In other words, in the production process of the thermoelectric conversion material, no matter how carefully the production process is performed, oxidation of the fine powder of the raw material proceeds due to oxygen in the order of ppb (parts per billion) contained in the inert gas, minute leakage from the pulverizing vessel, and the like. According to thermoelectric conversion material 11 of the present disclosure, the second additive element contained in the material adsorbs a minute amount of the mixed oxygen to prevent oxidation of SiGe itself which is the base material.

Figure 7:
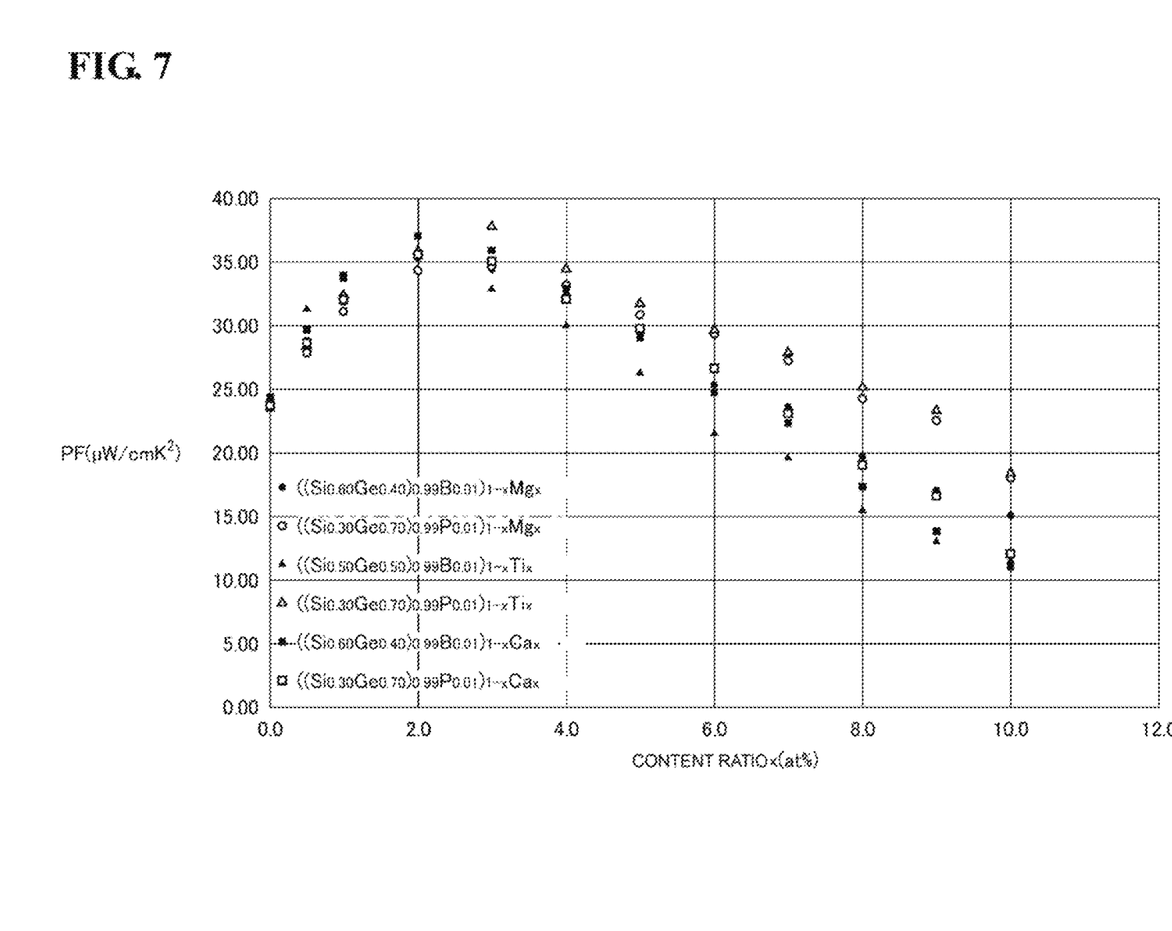
FIG. 7 is a graph showing the relationship between the content ratio and PF when the type of the second additive element and the content ratio of the second additive element are variously changed.

FIG. 7 is a graph showing the relationship between the content ratio and PF when the type of the second additive element and the content ratio of the second additive element are variously changed. In FIG. 7, the horizontal axis represents the content ratio x (at %) and the vertical axis represents PF ($\mu W/cmK^2$). In addition, Table 1 is a table showing the value of PF in FIG. 7, and shows the content ratio and the type of the second additive element.

TABLE 1

| | Addition of Mg | | Addition of Ti |
|---|---|---|---|
| Content Ratio | p-Type | n-Type | p-Type |
| x (at %) | $((Si_{0.60}Ge_{0.40})_{0.99}B_{0.01})_{1-x}Mg_x$ | $((Si_{0.30}Ge_{0.70})_{0.99}P_{0.01})_{1-x}Mg_x$ | $((Si_{0.50}Ge_{0.50})_{0.99}B_{0.01})_{1-x}Ti_x$ |
| 0.0 | 24.38 | 23.72 | 23.65 |
| 0.5 | 28.78 | 27.87 | 31.41 |
| 1.0 | 31.94 | 31.11 | 33.76 |
| 2.0 | 35.37 | 34.33 | 35.62 |
| 3.0 | 34.42 | 34.66 | 32.98 |
| 4.0 | 32.39 | 33.10 | 30.01 |
| 5.0 | 29.29 | 30.86 | 26.30 |
| 6.0 | 25.24 | 29.31 | 21.62 |
| 7.0 | 23.61 | 27.24 | 19.61 |
| 8.0 | 19.68 | 24.29 | 15.57 |
| 9.0 | 17.06 | 22.54 | 13.05 |
| 10.0 | 15.09 | 18.03 | 11.49 |

| | Addition of Ti | Addition of Ca | |
|---|---|---|---|
| Content Ratio | n-Type | p-Type | n-Type |
| x (at %) | $((Si_{0.30}Ge_{0.70})_{0.99}P_{0.01})_{1-x}Ti_x$ | $((Si_{0.60}Ge_{0.40})_{0.99}B_{0.01})_{1-x}Ca_x$ | $((Si_{0.30}Ge_{0.70})_{0.99}P_{0.01})_{1-x}Ca_x$ |
| 0.0 | 23.72 | 24.38 | 23.72 |
| 0.5 | 28.55 | 29.65 | 28.68 |
| 1.0 | 32.49 | 33.92 | 31.99 |
| 2.0 | 35.75 | 37.05 | 35.59 |
| 3.0 | 37.88 | 35.89 | 35.07 |
| 4.0 | 34.54 | 32.88 | 32.16 |
| 5.0 | 31.82 | 29.12 | 29.76 |
| 6.0 | 29.73 | 24.73 | 26.68 |
| 7.0 | 27.98 | 22.34 | 23.11 |
| 8.0 | 25.24 | 17.35 | 19.01 |
| 9.0 | 23.40 | 13.84 | 16.54 |
| 10.0 | 18.36 | 11.06 | 12.08 |

Referring to FIG. 7 and Table 1, in any of the second additive elements, when the content ratio is 0.5 at % to 5 at %, high PF can be maintained and PF is 26 ($\mu$W/cmK$^2$) or more.

Moreover, in the above-described embodiment, Mg is used as the second additive element, but the second additive element is not limited to Mg. Ca or Ti may be used as the second additive element. In other words, the second additive element may contain at least one of Mg, Ca, and Ti. The content ratio of the second additive element to the base material may be 0.5 at % to 5 at %.

Figure 8:
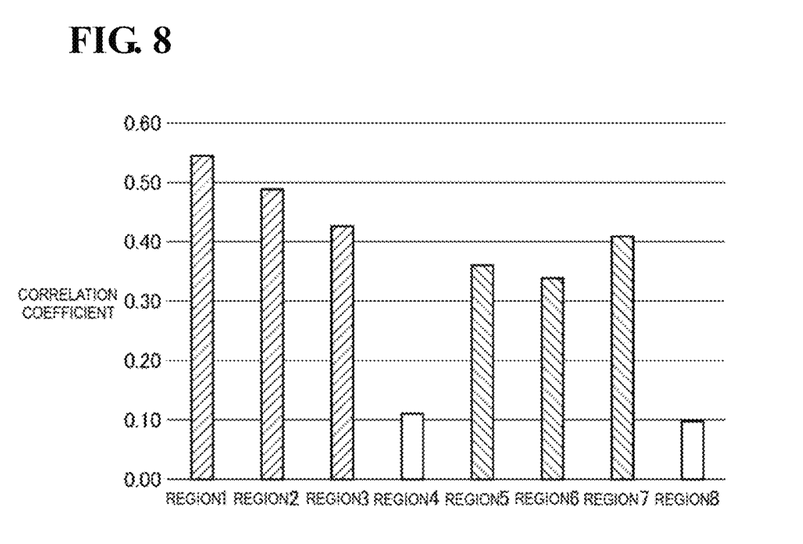
FIG. 8 is a graph showing the correlation coefficient in each region.
Figure 9:
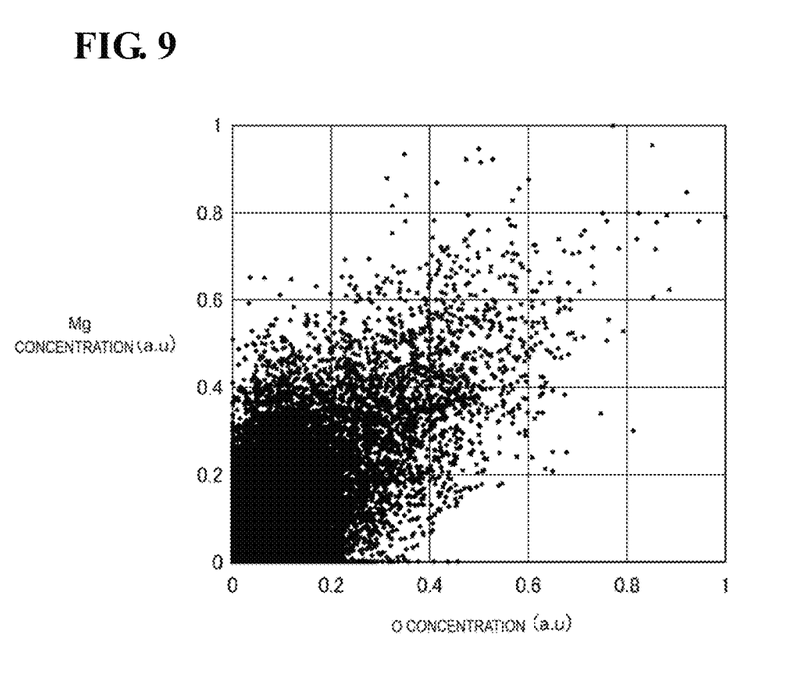
FIG. 9 is a graph showing the relationship between oxygen concentration and magnesium concentration.

FIG. 8 is a graph showing the correlation coefficients in each region. In FIG. 8, the horizontal axis represents each region and the vertical axis represents the correlation coefficient. It is noted that a region 1, a region 2, a region 3, and a region 4 represent the case of n-type SiGe added with 3 at % of Mg (sample 1), and a region 5, a region 6, a region 7, and a region 8 represent the case of p-type SiGe added with 3 at % of Mg (sample 2). Region 1, region 2, region 3, region 5, region 6 and region 7 are regions of 100 nm squares, as shown by region 18 in FIG. 3, and are selected so that second region 17, which is the high oxygen concentration region, and grain boundary 13 intersect opposite sides of each of the squares (fields of view). Region 4 and region 8 are first regions 16 which are regions excluding grain boundary 13, and are regions of 100 nm squares. FIG. 9 is a graph showing the relationship between oxygen concentration and magnesium concentration. In FIG. 9, the horizontal axis represents oxygen concentration, and the vertical axis represents magnesium concentration. FIG. 9 shows the oxygen concentration and the magnesium concentration within the 100 nm square indicated as region 18 in FIG. 3. In addition, Table 2 shows values of correlation coefficients in each region of sample 1 and sample 2.

TABLE 2

| ID | | Correlation Coefficient | Note |
|---|---|---|---|
| Sample 1 | Region1 | 0.54 | |
| | Region2 | 0.49 | |
| | Region3 | 0.43 | |
| | Region4 | 0.11 | Field of View Not Including Grain Boundary |
| Sample 2 | Region5 | 0.36 | |
| | Region6 | 0.34 | |
| | Region7 | 0.40 | |
| | Region8 | 0.10 | Field of View Not Including Grain Boundary |

It is noted that, the correlation coefficient r is calculated by the following expression (Equation 1) when concentrations (detection amounts) of O, and Mg in pixel i are represented by xi and yi respectively.

$$r = \frac{\Sigma(x_i - \bar{x})(y_i - \bar{y})}{\sqrt{\Sigma(x_i - \bar{x})^2 \Sigma(y_i - \bar{y})^2}}$$ [Equation 1]

Referring to FIG. 8 FIG. 9 and Table 1, first, it can be seen in FIG. 9 that the oxygen concentration and the magnesium concentration are distributed in the same manner. In other words, when the oxygen concentration is high, the magnesium concentration is also high, and when the oxygen concentration is low, the magnesium concentration is also low. Thus, it can be grasped that oxygen is adsorbed by magnesium.

Furthermore, as for the correlation coefficient, in a rectangular area of a section of base material 12, the rectangular area being selected such that grain boundary 13 intersects opposite sides of the rectangular area (region 1, region 2, region 3, region 5, region 6, and region 7), a distribution of the second additive element and the oxygen has a positive correlation. When the content ratio of the second additive element is 0.5 at % to 5 at %, the correlation coefficient of the correlation is in a range of 0.2 or more and less than 1.0 in the rectangular area of the cross section of base material 12, the rectangular area being selected such that a grain boundary intersects opposite sides of the rectangular area. In the rectangular area not including the grain boundary, that is, in region 4 and region 8, the correlation coefficients are 0.11 and 0.10, respectively. As described above, by the second additive element, it is possible to suppress the uniform oxygen concentration from being widely spread and to concentrate oxygen in grain boundary 13. In other words, PF can be increased more certainly, and the efficiency of thermoelectric conversion can be improved.

Second Embodiment

Next, a power generation element will be described as an embodiment of a thermoelectric conversion element using the thermoelectric conversion material according to the present disclosure.

Figure 10:
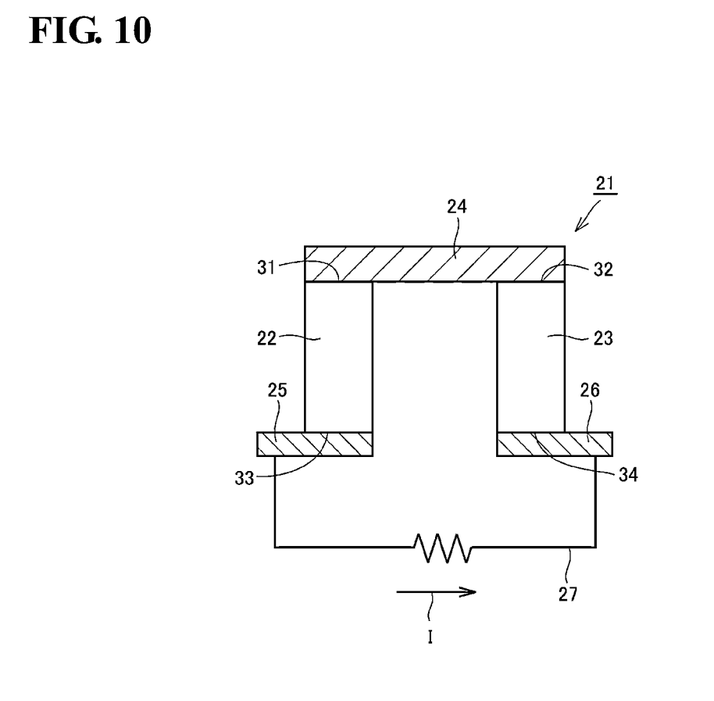
FIG. 10 is a schematic diagram showing the structure of am-thermoelectric conversion element (power generation element), which is a thermoelectric conversion element in the present embodiment.

FIG. 10 is a schematic diagram showing a structure of $\pi$-type thermoelectric conversion element (power generation element) which is a thermoelectric conversion element in the present embodiment. It is noted that, for ease of understanding, hatching indicating a cross section is partially omitted in FIG. 10.

Referring to FIG. 10, a $\pi$-type thermoelectric conversion element 21 includes a p-type thermoelectric conversion material unit 22, an n-type thermoelectric conversion material unit 23, a high-temperature-side electrode 24, a first low-temperature-side electrode 25, a second low-temperature-side electrode 26, and a wiring line 27. High-temperature-side electrode 24 is a first electrode disposed to be in contact with thermoelectric conversion material units 22, 23. First low-temperature-side electrode 25 is a second electrode that is in contact with thermoelectric conversion material unit 22 and is spaced apart from high-temperature-side electrode 24. Second low-temperature-side electrode 26 is a second electrode that is in contact with thermoelectric conversion material unit 23 and is spaced apart from high-temperature-side electrode 24.

The material constituting p-type thermoelectric conversion material unit 22 is, for example, the thermoelectric conversion material of the first embodiment whose components are adjusted such that the conductivity type will be p-type. The material constituting n-type thermoelectric conversion material unit 23 is, for example, the thermoelectric conversion material of the first embodiment whose components are adjusted such that the conductivity type will be n-type.

P-type thermoelectric conversion material unit 22 and n-type thermoelectric conversion material unit 23 are arranged side by side with a gap therebetween. High-temperature-side electrode 24 is disposed to extend from one end portion 31 of p-type thermoelectric conversion material unit 22 to one end portion 32 of n-type thermoelectric conversion material unit 23. High-temperature-side electrode 24 is disposed to contact both one end portion 31 of p-type thermoelectric conversion material unit 22 and one end portion 32 of n-type thermoelectric conversion material unit 23. High-temperature-side electrode 24 is disposed to connect one end portion 31 of p-type thermoelectric conversion material unit 22 and one end portion 32 of n-type thermoelectric conversion material unit 23. High-temperature-side electrode 24 is made of a conductive material, for example a metal. High-temperature-side electrode 24 is in ohmic contact with p-type thermoelectric conversion material unit 22 and n-type thermoelectric conversion material unit 23.

Thermoelectric conversion material unit 22 or thermoelectric conversion material unit 23 may be p-type or n-type, but either may be a metal conductor.

First low-temperature-side electrode 25 is disposed in contact with other end portion 33 of p-type thermoelectric conversion material unit 22. First low-temperature-side electrode 25 is spaced apart from high-temperature-side electrode 24. First low-temperature-side electrode 25 is made of a conductive material, for example a metal. First low-temperature-side electrode 25 is in ohmic contact with p-type thermoelectric conversion material unit 22.

Second low-temperature-side electrode 26 is disposed in contact with other end portion 34 of n-type thermoelectric conversion material unit 23. Second low-temperature-side electrode 26 is spaced apart from high-temperature-side electrode 24 and first low-temperature-side electrode 25. Second low-temperature-side electrode 26 is made of a conductive material, for example a metal. Second low-temperature-side electrode 26 is in ohmic contact with n-type thermoelectric conversion material unit 23.

Wiring line 27 is made of a conductor such as a metal. Wiring line 27 electrically connects first low-temperature-side electrode 25 and second low-temperature-side electrode 26.

In π-type thermoelectric conversion element 21, for example, when a temperature difference is formed so that the temperature of one end portion 31 of p-type thermoelectric conversion material unit 22 and one end portion 32 of n-type thermoelectric conversion material unit 23 is high and the temperature of other end portion 33 of p-type thermoelectric conversion material unit 22 and other end portion 34 of n-type thermoelectric conversion material unit 23 is low, p-type carriers (holes) move from one end portion 31 toward other end portion 33 in p-type thermoelectric conversion material unit 22. At this time, in n-type thermoelectric conversion material unit 23, n-type carriers (electrons) move from one end portion 32 toward other end portion 34. As a result, a current flows through wiring line 27 in an arrow I direction. In this way, in π-type thermoelectric conversion element 21, power generation by thermoelectric conversion utilizing a temperature difference is achieved. In other words, π-type thermoelectric conversion element 21 is a power generation element.

Thermoelectric conversion material 11 of the first embodiment is adopted as a material constituting p-type thermoelectric conversion material unit 22 and n-type thermoelectric conversion material unit 23. As a result, π-type thermoelectric conversion element 21 is a highly efficient power generation element.

Although the π-type thermoelectric conversion element has been described as an example of the thermoelectric conversion element of the present disclosure in the embodiment, the thermoelectric conversion element of the present disclosure is not limited to this. The thermoelectric conversion element of the present disclosure may be a thermoelectric conversion element having other structures such as, for example, an I-type (unileg-type) thermoelectric conversion element.

In addition, in the embodiment, thermoelectric conversion material 11 of the first embodiment is adopted as a material constituting p-type thermoelectric conversion material unit 22 and n-type thermoelectric conversion material unit 23, but the material is not limited to this. In other words, among the materials constituting p-type thermoelectric conversion material unit 22 and n-type thermoelectric conversion material unit 23, one material may be thermoelectric conversion material 11 of the first embodiment and the other material may be different from thermoelectric conversion material 11 of the first embodiment.

Third Embodiment

Figure 11:
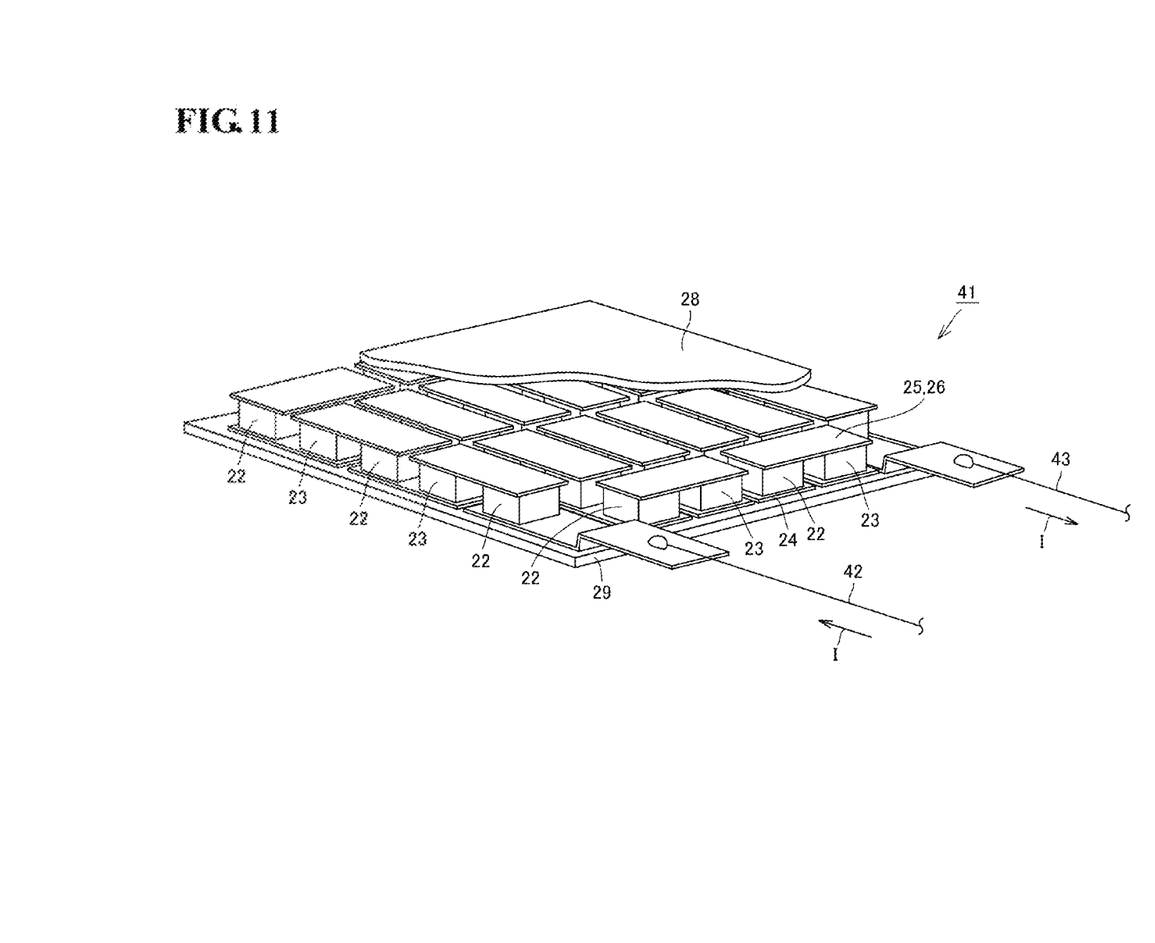
FIG. 11 is a diagram showing an example of a structure of a power generation module.

By electrically connecting a plurality of π-type thermoelectric conversion elements 21, a power generation module as a thermoelectric conversion module can be obtained. A power generation module 41, which is a thermoelectric conversion module of the present embodiment, has a structure in which a plurality of π-type thermoelectric conversion elements 21 are connected in series.

FIG. 11 is a diagram showing an example of a structure of a power generation module. Referring to FIG. 11, power generation module 41 of the present embodiment includes a plurality of p-type thermoelectric conversion material units 22, a plurality of n-type thermoelectric conversion material units 23, low-temperature-side electrodes 25 and 26 corresponding to first low-temperature-side electrode 25 and second low-temperature-side electrode 26, high-temperature-side electrode 24, a low-temperature-side insulator substrate 28, and a high-temperature-side insulator substrate 29. Low-temperature-side insulator substrate 28 and high-temperature-side insulator substrate 29 are made of ceramic such as alumina. P-type thermoelectric conversion material unit 22 and n-type thermoelectric conversion material unit 23 are alternately arranged. Low-temperature-side electrodes 25 and 26 are disposed in contact with p-type thermoelectric conversion material unit 22 and n-type thermoelectric conversion material unit 23 in the same manner as π-type thermoelectric conversion element 21 described above. High-temperature-side electrode 24 is disposed in contact with p-type thermoelectric conversion material unit 22 and n-type thermoelectric conversion material unit 23 in the same manner as π-type thermoelectric conversion element 21 described above. P-type thermoelectric conversion material unit 22 is connected to n-type thermoelectric conversion material unit 23 adjacent to one side via common high-temperature-side electrode 24. In addition, p-type thermoelectric conversion material unit 22 is connected to n-type thermoelectric conversion material unit 23 adjacent to the other side via common low-temperature-side electrodes 25 and 26. In this way, all p-type thermoelectric conversion material units 22 and n-type thermoelectric conversion material units 23 are connected in series.

Low-temperature-side insulator substrate 28 is disposed on the main surface of low-temperature-side electrodes 25 and 26 having a plate-like shape, the main surface being opposite to the other main surface in contact with p-type thermoelectric conversion material unit 22 and n-type thermoelectric conversion material unit 23. One low-temperature-side insulator substrate 28 is arranged for a plurality of (all) low-temperature-side electrodes 25, 26. High-temperature-side insulator substrate 29 is disposed on the main surface of high-temperature-side electrode 24 having a plate shape, the main surface being opposite to the other main surface in contact with p-type thermoelectric conversion material unit 22 and n-type thermoelectric conversion material unit 23. One high-temperature-side insulator substrate 29 is disposed for a plurality of (all) high-temperature-side electrodes 24.

Wiring lines 42 and 43 are connected to high-temperature-side electrode 24 or low-temperature-side electrodes 25 and 26 which are in contact with p-type thermoelectric conversion material unit 22 or n-type thermoelectric conversion material unit 23 located at both ends of p-type thermoelectric conversion material units 22 and n-type thermoelectric conversion material units 23 connected in series. Furthermore, when a temperature difference is formed so that the temperature of high-temperature-side insulator substrate 29 is high and the temperature of low-temperature-side insulator substrate 28 is low, a current flows in arrow I direction by the series-connected p-type thermoelectric conversion material unit 22 and n-type thermoelectric conversion material unit 23 as in the case of π-type thermoelectric conversion element 21. In this way, in power generation module 41, power generation by thermoelectric conversion using a temperature difference is achieved.

According to such power generation module 41, high thermoelectric conversion efficiency can be realized by including a plurality of thermoelectric conversion elements 21 of the present disclosure in which thermoelectric conversion efficiency is improved.

It should be understood that the embodiments disclosed herein are illustrative in all respects and are not restrictive in any respect. The scope of the present invention is defined not by the above description but by the claims, and is intended to include all modifications within the meaning and scope equivalent to the claims.

What is claimed is:

1. A thermoelectric conversion material comprising:
    a base material composed of SiGe;
    a first additive element functioning as a dopant;
    a second additive element different from the first additive element, the second additive element functioning as an oxygen getter; and
    oxygen,
    wherein
    the first additive element includes boron as a p-type dopant or phosphorus as a n-type dopant,
    the second additive element includes Mg,
    a content ratio of the second additive element relative to the base material is 0.5 at % to 5 at %, and
    in a rectangular area of a section of the base material, the rectangular area being selected such that a grain boundary intersects opposite sides of the rectangular area, a distribution of the second additive element and the oxygen has a positive correlation such that when the content ratio of the second additive element is greater, a content ratio of the oxygen is also greater.

2. The thermoelectric conversion material according to claim 1,
    wherein the rectangular area has a size of 100 nm square to 2 μm square and includes a first region in which the content ratio of the oxygen is a first content ratio and a second region in which the content ratio of the oxygen is a second content ratio higher than the first content ratio, and
    a difference between the first content ratio and the second content ratio is 10 at % or more.

3. The thermoelectric conversion material according to claim 1, wherein the thermoelectric conversion material comprises nitrogen.

4. The thermoelectric conversion material according to claim 1, wherein the base material contains an amorphous phase.

5. A thermoelectric conversion element comprising:
    a thermoelectric conversion material unit;
    a first electrode disposed to be in electrical contact with the thermoelectric conversion material unit; and
    a second electrode disposed to be in electrical contact with the thermoelectric conversion material unit and to be spaced apart from the first electrode,
    wherein the thermoelectric conversion material unit is composed of the thermoelectric conversion material according to claim 1, the thermoelectric conversion material containing components adjusted such that a conductivity type is p-type or n-type.

6. A thermoelectric conversion module comprising a plurality of the thermoelectric conversion elements according to claim 5.

7. A thermoelectric conversion material comprising:
    a base material composed of SiGe;
    a first additive element functioning as a dopant;
    a second additive element different from the first additive element, the second additive element functioning as an oxygen getter; and
    oxygen,
    wherein
    the first additive element includes boron as a p-type dopant or phosphorus as a n-type dopant,
    the second additive element includes Ca,
    a content ratio of the second additive element relative to the base material is 0.5 at % to 5 at %, and
    in a rectangular area of a section of the base material, the rectangular area being selected such that a grain boundary intersects opposite sides of the rectangular area, a distribution of the second additive element and the oxygen has a positive correlation such that when the content ratio of the second additive element is greater, a content ratio of the oxygen is also greater.

8. A thermoelectric conversion material comprising:
    a base material composed of SiGe;
    a first additive element functioning as a dopant;
    a second additive element different from the first additive element, the second additive element functioning as an oxygen getter; and
    oxygen,
    wherein
    the first additive element includes boron as a p-type dopant or phosphorus as a n-type dopant,
    the second additive element includes Ti,
    a content ratio of the second additive element relative to the base material is 0.5 at % to 5 at %, and
    in a rectangular area of a section of the base material, the rectangular area being selected such that a grain boundary intersects opposite sides of the rectangular area, a distribution of the second additive element and the oxygen has a positive correlation such that when the content ratio of the second additive element is greater, a content ratio of the oxygen is also greater.

9. The thermoelectric conversion material according to claim 1, wherein the content ratio of the second additive element relative to the base material is 0.7 at % to 5 at %.

* * * * *